United States Patent
Wang et al.

(10) Patent No.: US 10,997,879 B1
(45) Date of Patent: May 4, 2021

(54) SUPPORT FRAME AND ELECTRONIC SIGN

(71) Applicant: BOE TECHNOLOGY GROUP CO., LTD., Beijing (CN)

(72) Inventors: Zifeng Wang, Beijing (CN); Yan Ren, Beijing (CN); Yunpeng Wu, Beijing (CN); Junmin Sun, Beijing (CN); Jinggang Wei, Beijing (CN); Lei Cao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/843,212

(22) Filed: Apr. 8, 2020

(30) Foreign Application Priority Data

Oct. 31, 2019 (CN) .......................... 201921858519.8

(51) Int. Cl.
*G09F 9/30* (2006.01)
*H05K 5/02* (2006.01)
*H05K 5/00* (2006.01)

(52) U.S. Cl.
CPC ............. *G09F 9/30* (2013.01); *H05K 5/0017* (2013.01); *H05K 5/0234* (2013.01); *H05K 5/0247* (2013.01)

(58) Field of Classification Search
None
See application file for complete search history.

(56) References Cited

U.S. PATENT DOCUMENTS

| 4,429,478 A * | 2/1984 | Bruce-Sanders | ......... G09F 9/30 40/447 |
| D890,165 S * | 7/2020 | Wolff | ........................... D14/315 |
| 2005/0210722 A1* | 9/2005 | Graef | ........................ G09F 9/33 40/452 |
| 2011/0102328 A1* | 5/2011 | Chen | ..................... G06F 1/1618 345/169 |
| 2012/0236484 A1* | 9/2012 | Miyake | ................. G06F 1/1616 361/679.01 |
| 2014/0328041 A1* | 11/2014 | Rothkopf | ............ H04M 1/0216 361/807 |
| 2015/0261259 A1* | 9/2015 | Endo | .................... G02F 1/13338 361/679.06 |
| 2017/0238430 A1* | 8/2017 | Moon | .................. H05K 5/0004 361/679.01 |
| 2018/0007803 A1* | 1/2018 | Giuseppe | .............. G06F 1/1601 |
| 2018/0109871 A1* | 4/2018 | Huh | ...................... H04R 1/2811 |
| 2019/0364682 A1* | 11/2019 | Kikuchi | ................ G06F 1/1618 |

* cited by examiner

*Primary Examiner* — Xanthia C Cunningham
(74) *Attorney, Agent, or Firm* — Thomas | Horstemeyer, LLP

(57) ABSTRACT

This disclosure provides a support frame and an electronic sign. The support frame may include a base with elasticity, a first support portion including a first support plate and a first engaging portion, and a second support portion including a second support plate and a second engaging portion. Bottom ends of the first support plate and the second support plate are respectively connected to opposite ends of the base. Top ends of the first support plate and the second support plate extend in a direction closing to each other, and are disposed separately. The first engaging portion is disposed on a surface of the first support plate facing away from the second support plate, the second engaging portion is disposed on a surface of the second support plate facing away from the first support plate. Each of the two engaging portions can be respectively engaged with a display structure.

19 Claims, 3 Drawing Sheets

SUPPORT FRAME AND ELECTRONIC SIGN

CROSS-REFERENCE TO RELATED APPLICATION

This application is based on and claims priority to Chinese Patent Application No. 201921858519.8, filed on Oct. 31, 2019, the contents thereof being incorporated by reference in their entirety herein.

TECHNICAL FIELD

The present disclosure relates to the technical field of electronic devices and, in particular, to a support frame and an electronic sign.

BACKGROUND

Some conference signs are conventionally placed on a desktop to show names of people in corresponding positions or other information. The conference signs are generally double-sided. As shown in FIG. 1, a conventional conference sign is formed by a support frame 10 and a piece of folded paper 11, on both sides of which a name is written (this name may be in the dashed box in FIG. 1), and are respectively attached to both sides of the support frame 10, so that participants can sit in the correct seats and recognize each other. In terms of a single conference sign, it has a low cost and can be easily replaced, but if there are many participants, it is required to print the name of each of the participants and replace conference signs one by one, which wastes a lot of manpower and is easy for conference signs to be mistakenly placed.

At present, in order to improve the above situation, an electronic sign with a double-sided display is generally used to replace the conventional conference sign. In this case, contents displayed in the electronic sign can be replaced in an electronic controlling manner, which is fast to be replaced and reduces use of papers. However, a single-screen in the electronic sign is difficult to be disassembled or easy to fall off.

It should be noted that the information disclosed in the above "Background" section is only intended to enhance understanding of the background of the present disclosure and thus, may include information that does not constitute the prior art as already known by an ordinary person skilled in the art.

SUMMARY

An objective of the present disclosure is to provide a support frame and an electronic sign, which can facilitate the display structure for being disassembled and assembled, and make the display structure not easy to fall off.

The present disclosure provides a support frame including a base, a first support portion, and a second support portion. The first support portion includes a first support plate and a first engaging portion, and the second support portion includes a second support plate and a second engaging portion. A bottom end of the first support plate and a bottom end of the second support plate are respectively connected to opposite ends of the base. A top end of the first support plate and a top end of the second support plate extend in a direction closing to each other. The first engaging portion is disposed on a surface of the first support plate facing away from the second support plate, the second engaging portion is disposed on a surface of the second support plate facing away from the first support plate, and the first engaging portion and the second engaging portion are configured to engage with an object, respectively.

In one exemplary embodiment of the present disclosure, the base has a bottom plate, a first buffer plate, and a second buffer plate. A bottom end of the first buffer plate and a bottom end of the second buffer plate are respectively connected to opposite ends of the bottom plate, a top end of the first buffer plate and a top end of the second buffer plate extend in a direction closing to each other, and the top end of the first buffer plate and the bottom plate are spaced apart, and the top end of the second buffer plate and the bottom plate are spaced apart. The top end of the first buffer plate and the top end of the second buffer plate are respectively connected to the bottom end of the first support plate and the bottom end of the second support plate. An angle between the first buffer plate and the bottom plate is smaller than an angle between the first support plate and the bottom plate, and an angle between the second buffer plate and the bottom plate is smaller than an angle between the second support plate and the bottom plate.

In one exemplary embodiment of the present disclosure, the first support portion and the second support portion are symmetrically disposed with respect to a center line of the bottom plate, and the first buffer plate and the second buffer plate are symmetrically disposed with respect to the center line of the bottom plate.

In one exemplary embodiment of the present disclosure, each of the first engaging portion and the second engaging portion is formed with an engaging space corresponding to an engaging structure of the object.

In one exemplary embodiment of the present disclosure, a surface of the first support plate at the engaging space of the first engaging portion is a frosted surface, and a surface of the second support plate at the engaging space of the second engaging portion is a frosted surface.

In one exemplary embodiment of the present disclosure, the top end of the first engaging plate and the top end of the second engaging plate are disposed separately.

In one exemplary embodiment of the present disclosure, the base is formed of elastic material.

In one exemplary embodiment of the present disclosure, each of the first support portion and the second support portion is formed of elastic material.

In one exemplary embodiment of the present disclosure, the base, the first support portion and the second support portion are integrally formed.

In one exemplary embodiment of the present disclosure, the first engaging portion has an inserting groove extending in a direction parallel to the first support plate, so that the engaging structure of the object is inserted into the engaging space from either of both sides of the first support plate, and the second engaging portion has an inserting groove extending in a direction parallel to the second plate, so that the engaging structure of the object is inserted into the engaging space from either of both sides of the second support plate.

In one exemplary embodiment of the present disclosure, each of the first engaging portion and the second engaging portion is formed with a projection, so that the engaging structure of the object is pressed onto the first support plate and the second support plate through the projection of the first engaging portion and the projection of the second engaging portion, respectively.

In one exemplary embodiment of the present disclosure, each of the first engaging portion and the second engaging portion is formed with a recess, so that the engaging structure of the object is pressed onto the first support plate and the second support plate through the recess of the first engaging portion and the recess of the second engaging portion, respectively.

The present disclosure further provides an electronic sign system including a support frame according to any of the above embodiments; at least two electronic signs. Each of the at least two electronic signs includes: a first display structure including a first display screen and a first engaging structure disposed at a back side of the first display screen; the first engaging structure is engaged with the first engaging portion of the first support portion of the support frame; a second display structure includes a second display screen and a second engaging structure disposed at a back side of the second display screen; the second engaging structure is engaged with the second engaging portion; wherein a top end of the first display screen is in contact with a top end of the second display screen of the second support portion of the support frame.

In one exemplary embodiment of the present disclosure, when the top end of the first display screen is in contact with the top end of the second display screen, the first support plate and the second support plate are elastically deformed in a direction that away from each other.

In one exemplary embodiment of the present disclosure, the first engaging structure comprises a first power supply portion configured to supply power to the first display screen; and the second engaging structure comprises a second power supply portion configured to supply power to the second display screen.

In one exemplary embodiment of the present disclosure, the top end of the first display screen is in a surface contact with the top end of the second display screen.

In one exemplary embodiment of the present disclosure, a first anti-slip film is provided on each of the top end of the first display screen and the top end of the second display screen, and the first anti-slip film of the first display screen is in a surface contact with the first anti-slip film of the second display screen.

In one exemplary embodiment of the present disclosure, each of the first engaging portion and the second engaging portion is formed with an engaging space; the first power supply portion is engaged within the engaging space of the first engaging portion, and the first power supply portion is in a clearance fit with the first engaging portion; and the second power supply portion is engaged within the engaging space of the second engaging portion, and the second power supply portion is in a clearance fit with the second engaging portion.

In one exemplary embodiment of the present disclosure, each of a surface of the first power supply portion away from the first display screen and a surface of the second power supply portion away from the second display screen is provided with a second anti-slip film; and the second anti-slip film of the first power supply portion is attached to the first support plate, and the second anti-slip film of the second power supply portion is attached to the second support plate.

In one exemplary embodiment of the present disclosure, the first support plate and the first display screen are parallel to each other, and the second support plate and the second display screen are parallel to each other.

It should be understood that the above general description and the following detailed description are merely illustrative and explanatory and should not be construed as limiting the disclosure.

BRIEF DESCRIPTION OF THE DRAWINGS

The accompanying drawings, which are incorporated in the disclosure and constitute a part of the disclosure, show embodiments of the present disclosure and explain the principles of the present disclosure along with the specification. Understandably, the drawings as described below are only examples. For those having ordinary skilled in the art, other drawings may also be obtained according to these drawings without any creative effort.

DETAILED DESCRIPTION

Figure 1:
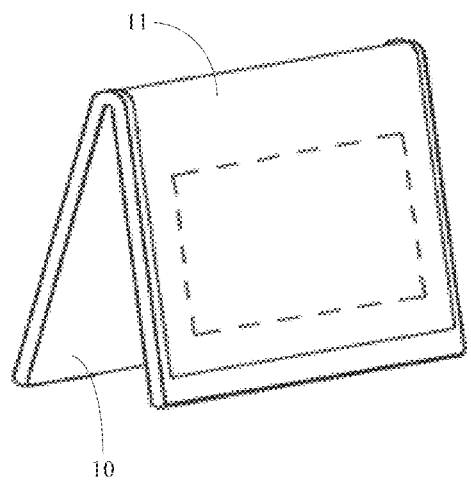
FIG. 1 is a schematic structural view of a conference sign in the prior art.

Now, the exemplary embodiments will be described more fully with reference to the accompanying drawings. However, the exemplary embodiments can be embodied in a variety of forms and should not be construed as limiting the embodiments set forth herein. Instead, these embodiments are provided so that the present disclosure will be thorough and complete, and the concepts of the exemplary embodiments will be fully given to those skilled in the art. The same reference numerals denote the same or similar structures in the drawings, and thus their detailed descriptions will be omitted.

The relative words, such as "upper" and "lower", as used herein, are directed to describe a relative relationship between one component and another component of an icon. These words are used herein for convenience only, for example, according to the direction of the illustrative examples as shown in the figures. It should be understood that if the device is turned upside down, the component indicated as being the "upper" side would become the component on the "lower" side. When one structure is "on" another structure, it is possible to indicate that the structure is integrally formed on the other structure, or one structure is "directly" disposed on the other structure, or one structure is "indirectly" disposed on the other structure through a further structure.

The terms such as "a," "an," "the," and "said" are used to indicate the presence of one or more elements, components, etc. The terms "comprise," "include," "have," "contain," and their variants are intended to be inclusive, and mean there may be additional elements, components, etc., in addition to the listed elements, components, etc.

Figure 2:
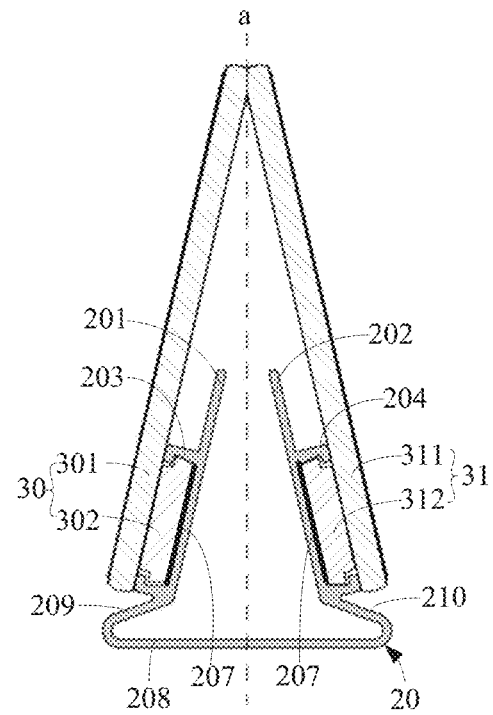
FIG. 2 is a schematic structural view of an electronic sign according to an embodiment of the present disclosure.

An embodiment of the present disclosure provides an electronic sign, which belongs to a display device. As shown in FIG. 2, the electronic sign may include a support frame 20, a first display structure 30, and a second display structure 31. The first display structure 30 and the second display structure 31 may be mounted on opposite sides of the support frame 20, so that the electronic sign has a double-sided display function. The electronic sign may be used in a conference as a conference sign, but it is not limited thereto, that is, it can also be used in public places (for example, shopping malls, supermarkets, theaters) for releasing business, financial, and entertainment information.

The electronic signs described in the embodiments of the present disclosure will be described in detail below with reference to the accompanying drawings.

As shown in FIG. 2, the first display structure 30 may include a first display screen 301 and a first power supply portion 302 mounted on a back side of the first display screen 301. The first power supply portion 302 is configured to supply power to the first display screen 301. For example, the first display screen 301 and the first power supply portion 302 may be assembled together by using a casing. Here, the casing may be a plastic casing to reduce weight of the first display structure 30, but it is not limited thereto. The first power supply portion 302 may be a battery assembly, and the first display screen 301 may be an electronic ink screen. The electronic ink screen may be controlled by an electrical system, and may be specifically operated on a peripheral terminal (for example, a computer) to replace the contents shown on the electronic ink screen. The electronic ink screen only consumes power while switching images, and hardly consumes power when normally displaying, so that the electronic ink screen in this embodiment is used as a display body to facilitate replacement of display contents and also reduce costs and energy consumption of the electronic signs.

As shown in FIG. 2, the second display structure 31 may include a second display screen 311 and a second power supply portion 312 mounted on the back side of the second display screen 311. The second power supply portion 312 is used to supply power to the second display screen 311. It should be noted that a specification of the second display structure 31 may be exactly the same as a specification of the first display structure 30. The second display screen 311 and the second power supply portion 312 may be assembled together using a casing, and the first power supply portion 302 may be a battery assembly and the second display screen 311 may be an electronic ink screen.

It should be noted that the aforementioned back side of the display screen refers to a surface disposed opposite to the display surface of the display screen.

Figure 3:
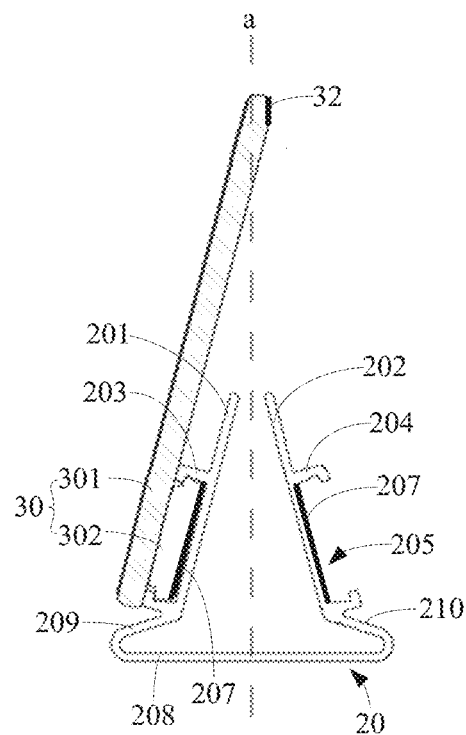
FIG. 3 is a schematic structural view showing that a first display structure is mounted on a first support portion in an electronic sign according to an embodiment of the present disclosure.

As shown in FIG. 2 and FIG. 3, the support frame 20 may be made of a metal material. This may ensure that the support frame 20 has a certain capacity of elastic memory, and thus facilitate its deformation or return, while ensuring support stability of the support frame 20. Specifically, the support frame 20 may include a base with elasticity, a first support portion, and a second support portion. The first support portion may include a first support plate 201 and a first engaging portion (which may also be called "first snap-fit portion", for example) 203, and the second support portion includes a second support plate 202 and the second engaging portion (which may also be called "second snap-fit portion", for example) 204.

As shown in FIG. 2 and FIG. 3, a bottom end of the first support plate 201 and a bottom end of the second support plate 202 are respectively connected to opposite ends of the base. A top end of the first support plate 201 and a top end of the second support plate 202 extend in a direction closing to each other, and are disposed separately. The first engaging portion 203 is disposed on a surface of the first support plate 201 facing away from the second support plate 202, the second engaging portion 204 is disposed on a surface of the second support plate 202 facing away from the first support plate 201, and the first engaging portion 203 and the second engaging portion 204 may be respectively engaged with (e.g., snapped-fit to) a display structure (or an electronic sign, or other similar objects). Also, the display structure may be inserted, pushed, or pressed into either of these engaging portions. For example, the first engaging portion 203 may be engaged with a first power supply portion 302 in the first display structure 30, so that the first display structure 30 is mounted on the first support portion. The second engaging portion 204 may be engaged with a second power supply portion 312 in the second display structure 31, so that the second display structure 31 is mounted on the second support portion.

As the first power supply portion 302 and the second power supply portion 312 are required to be replaced after use for a certain period, when service life of the first display screen 301 and the second display screen 311 expires, or for other reasons, the first display structure 30 and the second display structure 31 may need to be removed from the support frame 20 for replacement. Thus, as compared with a solution in which the display structure is mounted onto the support frame 20 in connection manners such as screws and gluing, a solution in which the display structure is mounted onto the support frame 20 by engaging the power supply portion with the engaging portion in this embodiment, thereby facilitating disassembly and assembly between the display structure and the support frame 20, and improving disassembly and assembly efficiency therebetween.

Figure 6:
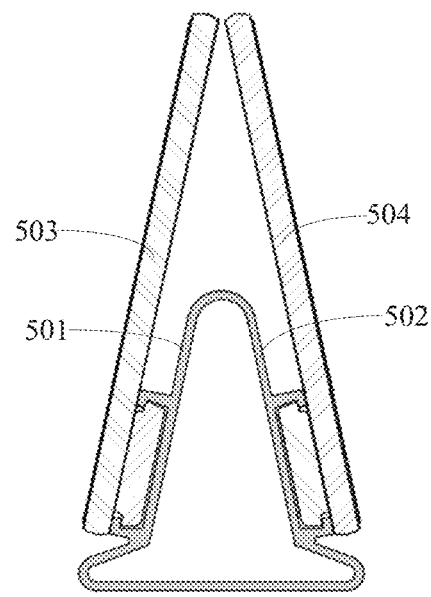
FIG. 6 is a schematic side plan view of the electronic sign as shown in FIG. 5.

In addition, as shown in FIG. 2 and FIG. 3, as compared with a solution in which the top end of the first support plate 501 is connected with the top end of the second support plate 502 in the related art (as shown in FIG. 6), the top end of the first support plate 201 and the top end of the second support plate 202 in the support frame 20 are designed to be disposed separately, to enhance deformation and return capabilities of the first support plate 201 and the second support plate 202 in the support frame 20. This design may not only facilitate the first display structure 30 and a second display structure 31 to be detached from the support frame 20, and structural stability of the support frame 20 can also be ensured.

Optionally, as shown in FIG. 2 and FIG. 3, the first engaging portion 203 and the second engaging portion 204 are each formed with an engaging space 205, the first power supply portion 302 may be engaged in the engaging space 205 of the first engaging portion, and the second power supply portion 312 may be engaged in the engaging space 205 of the second engaging portion. In order to ensure stability of engagements between the first power supply portion 302 and the first engaging portion and between the second power supply portion 312 and the second engaging portion, in this embodiment, a slot in engagement with a hook of the first engaging portion 203 may be provided at a junction between the first power supply portion 302 and the first display screen 301, and a slot in engagement with a hook of the second engaging portion 204 is provided at a junction between the second power supply portion 312 and the second display screen 311.

Optionally, the first engaging portion 203 may have an inserting groove extending in a direction parallel to the first support plate 201, so that the engaging structure of an object (for example, a display structure or an electronic sign) may be inserted into the engaging space 205 from either of both sides of the first support plate 201. Optionally, the second engaging portion 204 may also have an inserting groove extending in a direction parallel to the second plate 202, so that the engaging structure of the object (for example, a display structure or an electronic sign) is inserted into the engaging space 205 from either of both sides of the second support plate 202.

Optionally, each of the first engaging portion 203 and the second engaging portion 204 is formed with a projection or recess, so that the engaging structure of the object may be pressed onto the first support plate and the second support plate through the projection or the recess of the first engaging portion 203 and the projection or the recess of the second engaging portion 204, respectively.

It should be noted that, the first display screen 301 and the first power supply portion 302 mentioned above may be connected together through a casing, and the second display screen 311 and the second power supply portion 312 may be connected together through a casing. Therefore, the aforementioned slot may be formed at a part of the casing corresponding to the junction between the display screen and the power supply portion.

Further, as shown in FIG. 2 and FIG. 3, a surface of the first support plate 201 at the engaging space 205 of the first engaging portion 203 is a frosted surface 207 to increase its frictional adhesion; similarly, a surface of the second support plate 202 at the engaging space 205 of the second engaging portion 204 is the frosted surface 207 (a matte-treated surface) to increase its frictional adhesion. In this way, when the first power supply portion 302 is engaged in the engaging space 205 of the first engaging portion 203, the first power supply portion 302 is in contact with the frosted surface 207 on the first support plate 201 to increase friction force between the first power supply portion 302 and the first support plate 201, such that the situation that the first power supply portion 302 is detached from the engaging space 205 of the first engaging portion 203 can be alleviated, and assembly stability between the first display structure 30 and the first support portion can be ensured. Similarly, when the second power supply portion 312 is engaged in the engaging space 205 of the second engaging portion 204, the second power supply portion 312 is in contact with the frosted surface 207 on the second support plate 202 to increase the friction force between the second power supply portion 312 and the second support plate 202, such that the situation that the second power supply portion 312 is detached from the engaging space 205 of the second engaging portion 204 can be alleviated, and assembly stability between the second display structure 31 and the second support portion can be ensured.

Optionally, as shown in FIG. 2 and FIG. 3, the base of the support frame 20 has a bottom plate 208, a first buffer plate 209, and a second buffer plate 210. The bottom plate 208 may be a rectangular plate to facilitate for symmetrical design of the support frame 20, but is not limited thereto. A bottom end of the first buffer plate 209 and a bottom end of the second buffer plate 210 are respectively connected to the opposite ends of the bottom plate 208, and a top end of the first buffer plate 209 and a top end of the second buffer plate 210 extend in a direction closing to each other. The top end of the first buffer plate 209 and the bottom plate 208 are separately disposed, and the top end of the second buffer plate 210 and the bottom plate 208 are separately disposed, that is, a buffer space is formed between the first buffer plate 209 and the bottom plate 208, and a buffer space is formed between the second buffer plate 210 and the bottom plate 208, in this way, elasticity of the base of the support frame 20 can be increased.

The top end of the first buffer plate 209 and the top end of the second buffer plate 210 are connected to the bottom end of the first support plate 201 and the bottom end of the second support plate 202, respectively. An angle between the first buffer plate 209 and the bottom plate 208 is smaller than an angle between the first support plate 201 and the bottom plate 208. An angle between the second buffer plate 210 and the bottom plate 208 may be smaller than an angle between the second support plate 202 and the bottom plate 208, so that support stability of the support frame 20 can be ensured while ensuring elasticity of the support frame 20.

It should be noted that the first support portion and the second support portion may be symmetrically disposed with respect to a center line a of the bottom plate 208. The first buffer plate 209 and the second buffer plate 210 may be symmetrically disposed with respect to the center line a of the bottom plate 208. It should be understood that, as the specifications of the first display structure 30 and the second display structure 31 may be completely the same, the first display structure 30 and the second display structure 31 may also be symmetrically disposed with respect to the center line a of the bottom plate 208 when the first display structure 30 and the second display structure 31 are respectively mounted on the first support portion and the second support, so as to ensure that the entire electronic sign is a symmetrical structure, and the center of gravity of the entire electronic sign is located at the center line a of the bottom plate 208, thereby ensuring the structural stability of the entire electronic sign and avoiding the situation that the electronic sign is prone to fall off.

It should also be noted that the support frame 20 of this embodiment may be an integrated structure to ensure the structural stability of the entire support frame 20. In other words, the base, the first support portion and the second support portion may be integrally formed.

Figure 5:
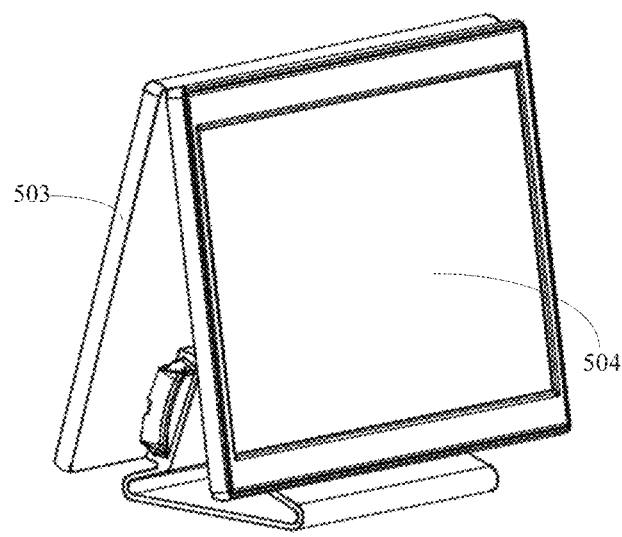
FIG. 5 is a schematic structural view of an electronic sign in the related art.

In an embodiment, as shown in FIG. 2, after the first power supply portion 302 is engaged with the first engaging portion 203 and the second power supply portion 312 is engaged with the second engaging portion 204, the top end of the first display screen 301 is in contact with the top end of the second display screen 311, so that as compared with the solution in that the top end of the first display screen 503 and the top end of the second display screen 504 are separately disposed (as shown in FIG. 5 and FIG. 6), the situation that the first display screen 301 and the second display screen 311 are prone to shake during use can be avoided, and thus the situation that the first display structure 30 and the second display structure 31 are easily detached from the support frame 20 can be avoided, and the structural stability of the entire electronic sign can be ensured.

Specifically, as shown in FIG. 2, when the top end of the first display screen 301 is in contact with the top end of the second display screen 311, the first support plate 201 and the second support plate 202 are elastically deformed in a direction away from each other. At this time, the first support plate 201 and the second support plate 202 each generate a return force. Under an action of the return force, the top end of the first display screen 301 and the top end of the second display screen 311 can be in close contact with each other to ensure structural stability of the electronic sign.

It should be understood that, in order to make the first support plate 201 and the second support plate 202 elastically deform in a direction away from each other when the top end of the first display screen 301 is in contact with the top end of the second display screen 311, when a single display structure is assembled on the support frame 20, for example, when the first display structure 30 is assembled on the first support portion, as shown in FIG. 3, the top end of the first display screen 301 in the first display structure 30 should be beyond the center line a of the bottom plate 208, so that when the second display structure 31 is assembled on the second support portion, firstly, a pulling force is applied to the second support plate 202 to pull the second support plate 202 away from the first support plate 201, that is, the second support plate 202 is elastically deformed in a direction away from the first support plate 201 to prevent interference between the second display screen 311 and the first display screen 301 during engagement between the second power supply portion 312 and the second engaging portion 204, thereby facilitate assembling the second display structure 31 to the second support portion. After the second display structure 31 is assembled on the second support portion, the pulling force applied to the first support plate 201 is removed. The first support plate 201 moves in a direction closing to the second support plate 202 under the action of its own return force. During the return process of the first support plate 201, the top end of the second display screen 311 can apply a pushing force to the top end of the first display screen 301 to push the top end of the first display screen 301 to move away from the second support plate 202, so as to drive the top end of the first support plate 201 to move away from the second support plate 202, that is, elastic deformation occurs in a direction away from the second support plate 202. At this time, the first support plate 201 will generate a return force, and the top end of the second support plate 202 is not reset to the initial position. Therefore, the second support plate 202 still has a part of the return force.

When the return force of the first support plate 201 is the same as that of the second support plate 202, the first display screen 301 and the second display screen 311 reach a balanced state; and the top end of the first display screen 301 and the top end of the second display screen 311 can be brought into close contact under the return force of the first support plate 201 and the second support plate 202. As shown in FIG. 2, the center line a of the bottom plate 208 may pass through the position where the top end of the first display screen 301 is in contact with the top end of the second display screen 311, to ensure the symmetry of the electronic sign, ensure the stability of the electronic sign, and avoid the situation that the electronic sign is prone to fall off.

In addition, the top end of the first display screen 301 and the top end of the second display screen 311 may be brought into close contact under the return force of the first support plate 201 and the second support plate 202, as shown in FIG. 2, the first power supply portion 302, the second power supply portion 312 may also be in close contact with the frosted surface 207 on the first support plate 201 and the frosted surface 207 on the second support plate 202, respectively, so as to achieve mutual limitation, and thus improve the assembly stability of the first display structure 30 and the second display structure 31. Based on this solution, the interferences between the first power supply portion 302 and the first engaging portion 203, and between the second power supply portion 312 and the second engaging portion 204 in this embodiment are not required, that is, the first power supply portion 302 is in clearance fit with the first engaging portion 20; the second power supply portion 312 is in clearance fit with the second engaging portion 204, so that the first power supply portion 302 can be easily inserted into the engaging space 205 of the first engaging portion 203, and the second power supply portion 312 can be easily inserted into the engaging space 205 of the second engaging portion 204.

Figure 4:
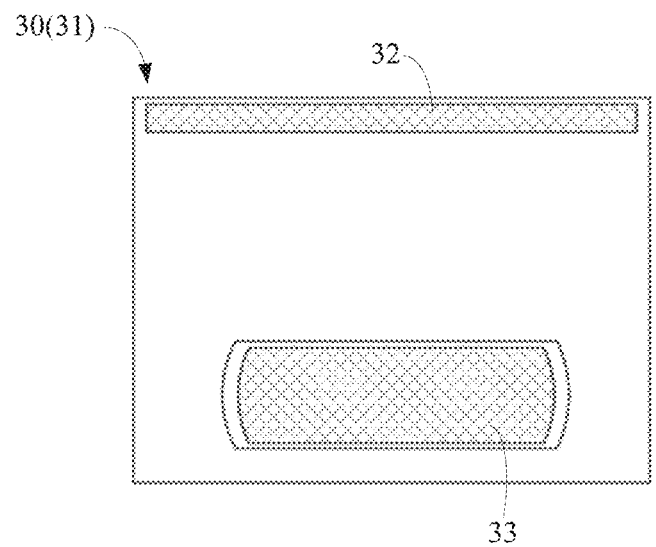
FIG. 4 is a schematic plan view of a first display structure or a second display structure in an electronic sign according to an embodiment of the present disclosure.

Optionally, as shown in FIG. 2, the top end of the first display screen 301 may be in surface contact with the top end of the second display screen 311 to increase a contacting area between the first display screen 301 and the second display screen 311. Further, as shown in FIG. 3 and FIG. 4, each of the top end of the first display screen 301 and the top end of the second display screen 311 is provided with a first anti-slip film 32. The surface contact between the first anti-slip film 32 of the first display screen 301 and the first anti-slip film 32 of the second display screen 311 can increase the friction force between the first display screen 301 and the second display screen 311, and ensure the stable contact between the first display screen 301 and the second display screen 311.

Each of a surface of the first power supply portion 302 away from the first display screen 301 and a surface of the second power supply portion 312 away from the second display screen 311 is provided with a second anti-slip film 33. The second anti-slip film 33 of the first power supply portion 302 may be attached to the first support plate 201, and specifically to the frosted surface 207 of the first support plate 201, to increase the friction force between the first power supply portion 302 and the first support plate 201, thereby ensuring that the first display structure 30 is stably mounted on the first support portion. The second anti-slip film 33 of the second power supply portion 312 may be attached to the second support plate 202, and specifically to the frosted surface 207 of the second support plate 202, to increase the friction between the second power supply portion 312 and the second support plate 202, thereby ensuring that the second display structure 31 is stably mounted on the second support portion.

It should be noted that the first anti-slip film 32 and the second anti-slip film 33 may be made of an ultra-high molecular polyethylene material, so that the first anti-slip film 32 and the second anti-slip film 33 have advantages such as abrasion resistance, impact resistance, corrosion resistance, self-lubrication, impact absorption, and the like.

In addition, it should be noted that, in order to ensure the appearance and texture of the first display structure 30 and the second display structure 31, grooves may be provided at a part of the casing facing to the top end of the display screen and at a part of the casing facing to the power supply portion. The first anti-slip film 32 and the second anti-slip film 33 may be respectively located in the grooves, and a thickness of the first anti-slip film 32 or the second anti-slip film 33 may be equal to or slightly larger than a depth of the groove thereof.

Optionally, as shown in FIG. 2, when the first display structure 30 and the second display structure 31 are respectively mounted on the first support structure and the second support structure, and the top end of the first display screen 301 is in contact with the top end of the second display screen 311, the first support plate 201 and the first display screen 301 are parallel to each other, and the second support plate 202 and the second display screen 311 are parallel to each other, to ensure the structural stability of the entire electronic sign.

In addition, in the present disclosure, the top end of the first support plate and the top end of the second support plate in the support frame are disposed separately, to increase the deformation capacity of the first support plate and the second support plate in the support frame, and facilitate engaging the two display structures respectively to the first engaging portion and the second engaging portion, so as to assemble an electronic sign.

In other embodiments,

The person skilled in the art, upon consideration of the specification and after practice of this disclosure, would understandably conceive of the other embodiments of the present disclosure. The present disclosure is directed to encompass any variation, use, or adaptive change, which accord to the general principles of the present disclosure and include common knowledge or the customary means in the art but not disclosed in the present disclosure. The specification and the embodiments are regarded to be illustrative only, and the scope and the spirit of the present disclosure is defined within the claims.

What is claimed is:

1. A support frame, comprising:
a base, a first support portion, and a second support portion, wherein:
the first support portion comprises a first support plate and a first engaging portion;
the second support portion comprises a second support plate and a second engaging portion;
a bottom end of the first support plate and a bottom end of the second support plate are respectively connected to opposite ends of the base;
a top end of the first support plate and a top end of the second support plate extend in a direction closing to each other;
the first engaging portion is disposed on a surface of the first support plate facing away from the second support plate;
the second engaging portion is disposed on a surface of the second support plate facing away from the first support plate; and
the first engaging portion and the second engaging portion are configured to engage with an object, respectively.

2. The support frame according to claim 1, wherein:
the base has a bottom plate, a first buffer plate, and a second buffer plate;
a bottom end of the first buffer plate and a bottom end of the second buffer plate are respectively connected to opposite ends of the bottom plate;
a top end of the first buffer plate and a top end of the second buffer plate extend in a direction closing to each other;
the top end of the first buffer plate and the bottom plate are spaced apart, and the top end of the second buffer plate and the bottom plate are spaced apart;
the top end of the first buffer plate and the top end of the second buffer plate are respectively connected to the bottom end of the first support plate and the bottom end of the second support plate;
an angle between the first buffer plate and the bottom plate is smaller than an angle between the first support plate and the bottom plate; and
an angle between the second buffer plate and the bottom plate is smaller than an angle between the second support plate and the bottom plate.

3. The support frame according to claim 2, wherein:
the first support portion and the second support portion are symmetrically disposed with respect to a center line of the bottom plate; and
the first buffer plate and the second buffer plate are symmetrically disposed with respect to the center line of the bottom plate.

4. The support frame according to claim 1, wherein each of the first engaging portion and the second engaging portion is formed with an engaging space corresponding to an engaging structure of the object.

5. The support frame according to claim 4, wherein:
a surface of the first support plate at the engaging space of the first engaging portion is a frosted surface; and
a surface of the second support plate at the engaging space of the second engaging portion is a frosted surface.

6. The support frame according to claim 1, wherein the top end of the first engaging plate and the top end of the second engaging plate are disposed separately.

7. The support frame according to claim 1, wherein the base is formed of elastic material.

8. The support frame according to claim 1, wherein each of the first support portion and the second support portion is formed of elastic material.

9. The support frame according to claim 1, wherein the base, the first support portion, and the second support portion are integrally formed.

10. The support frame according to claim 4, wherein:
the first engaging portion has an inserting groove extending in a direction parallel to the first support plate, such that the engaging structure of the object is inserted into the engaging space from either of both sides of the first support plate; and
the second engaging portion has an inserting groove extending in a direction parallel to the second plate, such that the engaging structure of the object is inserted into the engaging space from either of both sides of the second support plate.

11. The support frame according to claim 1, wherein each of the first engaging portion and the second engaging portion is formed with a projection, so that the engaging structure of the object is pressed onto the first support plate and the second support plate through the projection of the first engaging portion and the projection of the second engaging portion, respectively.

12. The support frame according to claim 1, wherein each of the first engaging portion and the second engaging portion is formed with a recess, so that the engaging structure of the object is pressed onto the first support plate and the second support plate through the recess of the first engaging portion and the recess of the second engaging portion, respectively.

13. An electronic sign system, comprising:
a support frame comprising a base, a first support portion having a first support plate and a first engaging portion, and a second support portion comprises a second support plate and a second engaging portion; and
at least two electronic signs, each comprising:
a first display structure comprising a first display screen and a first engaging structure disposed at a back side of the first display screen, the first engaging structure being engaged with the first engaging portion of the first support portion of the support frame; and
a second display structure comprising a second display screen and a second engaging structure disposed at a back side of the second display screen, the second engaging structure being engaged with the second engaging portion of the second support portion of the support frame, wherein:
a bottom end of the first support plate and a bottom end of the second support plate are respectively connected to opposite ends of the base; a top end of the first support plate and a top end of the second support plate extend in a direction closing to each other;
the first engaging portion is disposed on a surface of the first support plate facing away from the second support plate, the second engaging portion is disposed on a surface of the second support plate facing away from the first support plate, and the first engaging portion and the second engaging portion are configured to engage with electronic signs; and
a top end of the first display screen is in contact with a top end of the second display screen.

14. The electronic sign system according to claim 13, wherein:

the first engaging structure comprises a first power supply portion configured to supply power to the first display screen; and the second engaging structure comprises a second power supply portion configured to supply power to the second display screen.

15. The electronic sign system according to claim 13, wherein, when the top end of the first display screen is in contact with the top end of the second display screen, the first support plate and the second support plate are elastically deformed in a direction away from each other.

16. The electronic sign system according to claim 13, wherein:

a first anti-slip film is provided on each of the top end of the first display screen and the top end of the second display screen; and the first anti-slip film of the first display screen is in a surface contact with the first anti-slip film of the second display screen.

17. The electronic sign system according to claim 13, wherein:

each of the first engaging portion and the second engaging portion is formed with an engaging space;

the first power supply portion is engaged within the engaging space of the first engaging portion, and the first power supply portion is in a clearance fit with the first engaging portion; and the second power supply portion is engaged within the engaging space of the second engaging portion, and the second power supply portion is in a clearance fit with the second engaging portion.

18. The electronic sign system according to claim 17, wherein:

each of a surface of the first power supply portion away from the first display screen and a surface of the second power supply portion away from the second display screen is provided with a second anti-slip film; and the second anti-slip film of the first power supply portion is attached to the first support plate, and the second anti-slip film of the second power supply portion is attached to the second support plate.

19. The electronic sign system according to claim 13, wherein:

the first support plate and the first display screen are parallel to each other; and the second support plate and the second display screen are parallel to each other.

* * * * *